United States Patent
Chhabra

(10) Patent No.: US 10,541,020 B2
(45) Date of Patent: Jan. 21, 2020

(54) CONTROLLER ARCHITECTURE FOR REDUCING ON-DIE CAPACITANCE

(71) Applicant: Seagate Technology LLC, Cupertino, CA (US)

(72) Inventor: Nitin Kumar Chhabra, Pune (IN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/906,998

(22) Filed: Feb. 27, 2018

(65) Prior Publication Data

US 2019/0267069 A1 Aug. 29, 2019

(51) Int. Cl.
| | |
|---|---|
| G11C 7/00 | (2006.01) |
| G11C 11/409 | (2006.01) |
| G11C 11/4076 | (2006.01) |
| G11C 11/408 | (2006.01) |
| G11C 7/10 | (2006.01) |
| G06F 13/42 | (2006.01) |
| G11C 11/4096 | (2006.01) |
| G11C 7/22 | (2006.01) |

(52) U.S. Cl.
CPC ........ *G11C 11/409* (2013.01); *G06F 13/4243* (2013.01); *G11C 7/10* (2013.01); *G11C 7/22* (2013.01); *G11C 11/408* (2013.01); *G11C 11/4076* (2013.01); *G11C 11/4096* (2013.01); *G11C 2207/10* (2013.01)

(58) Field of Classification Search
CPC .................................................. G11C 11/409
USPC .......................................................... 365/191
See application file for complete search history.

(56) References Cited

U.S. PATENT DOCUMENTS

| | | | |
|---|---|---|---|
| 2009/0033391 A1* | 2/2009 | Vergnes | G11C 29/02 327/161 |
| 2009/0219779 A1* | 9/2009 | Mao | G06F 13/1684 365/233.11 |
| 2013/0249612 A1 | 9/2013 | Zerbe et al. | |
| 2014/0016404 A1 | 1/2014 | Kim et al. | |
| 2015/0206560 A1* | 7/2015 | Kang | G11C 7/1066 711/103 |

* cited by examiner

*Primary Examiner* — Hoai V Ho
(74) *Attorney, Agent, or Firm* — Holtzer Patel Drennan

(57) ABSTRACT

The disclosed controller includes a DDR architecture that includes a dual-channel interface designed to include DQS IO ports configured to generate a first DQS signal that is a distance of substantially 0.125 times the period of a clock signal (ΔT denoting the 0.125 of the period of the clock signal) ahead of a rising edge of the clock signal and a second DQS signal that is a distance of substantially 0.125 times the period of the clock signal behind the rising edge of a clock signal. If ΔT is more than a tDQSS then ΔT is set to tDQSS, where tDQSS is a maximum allowable time between either DQS signal and the rising edge of the clock signal.

12 Claims, 4 Drawing Sheets

CONTROLLER ARCHITECTURE FOR REDUCING ON-DIE CAPACITANCE

BACKGROUND

Consumer demands for microelectronics with decreased size and increased capability create ongoing design challenges for device manufacturers. A microelectronic device may include a number of components electrically coupled to a printed circuit board. For example, a printed circuit board may include one or more chips as well as decoupling capacitors that help to reduce excessive noise and memory errors in signals sent to and from the chip.

In storage devices that have a dual-channel interface, there may be high instantaneous switching current requiring multiple on-die capacitors, which can increase cost and current leakage.

SUMMARY

Implementations described and claimed herein provide a multi-channel double data rate (DDR) interface of a hard disk drive or solid state drive controller which includes a DDR architecture that includes a dual-channel interface designed to include DQ Strobe (DQS) IO ports configured to generate a DQS signal that is substantially 0.125 of a clock signal ($\Delta T$ denoting the 0.125 of the period of the clock signal) ahead of a rising edge of the clock signal and another DQS signal that is substantially 0.125 of the clock signal behind the rising edge of a clock signal. If $\Delta T$ is more than a tDQSS then $\Delta T$ is set to tDQSS, where tDQSS is a maximum allowable time between either DQS signal and the rising edge of the clock signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

These and various other features and advantages will be apparent from a reading of the following Detailed Description.

BRIEF DESCRIPTIONS OF THE DRAWINGS

DETAILED DESCRIPTION

Figure 1A:
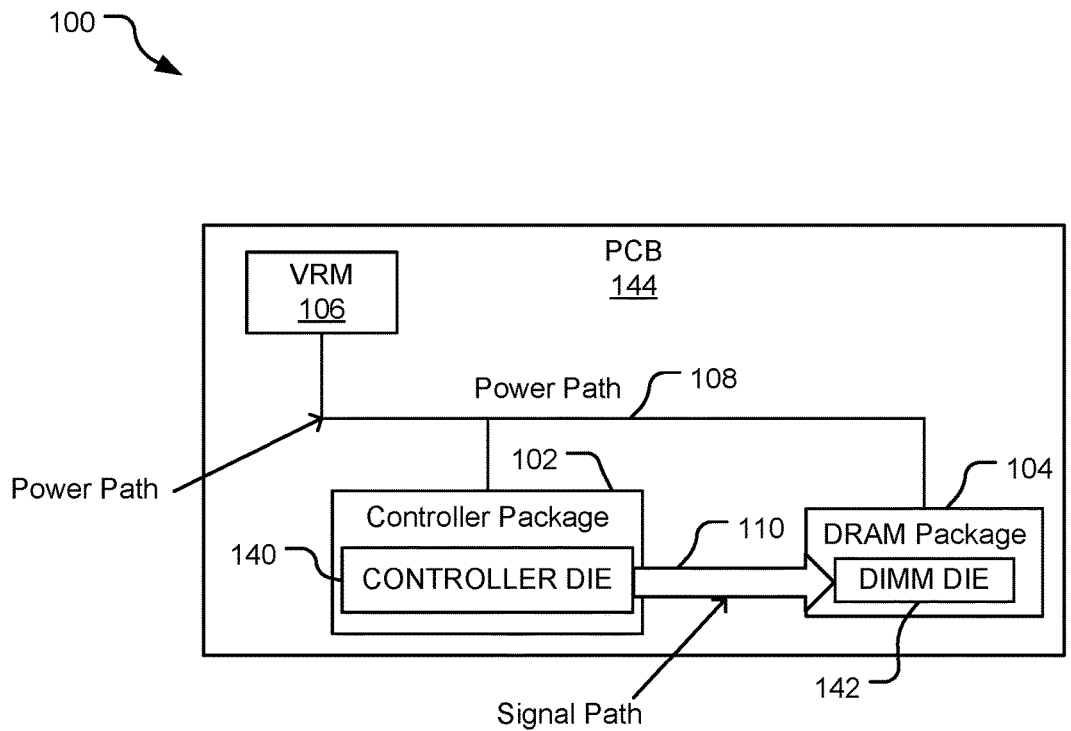
FIG. 1A is a functional block diagram of an example data storage device.

The disclosed technology is directed toward a system with a reduced on-die capacitance requirement for a multi-channel double data rate (DDR) interface of a hard disk drive (HDD) or a solid-state drive (SSD) controller. During IO switching, the transient current has high frequency components that cannot be handled by the on-board capacitors on the controller. On-die capacitors can be used to ensure the variation of an IO supply voltage is within a specified range. The on-die capacitors provide the instantaneous current required for IO switching. If there are too few on-die capacitors to provide the instantaneous current required for IO switching, current may be drawn from on board capacitors, causing a dynamic voltage drop (modeled by L(dI/dt)) which may exceed allowable variations in the on-die IO supply voltage. Alternatively, too many on-die capacitors may increase the overall cost of a device as well as resulting in current leakage.

In a dual channel DDR interface, both channels operate independently. Each channel has 8 single-ended data signal DQ IO and 1 dual data strobe signal DQS IO operating in a read-write mode. Each channel draws the most current during switching, which occurs on the rising edge and falling edge of the DQS signal. The current a single channel uses during switching may be modeled as:

$$I_{CHANNEL}=(8*idq)+idqs$$

where idq is the current drawn by a single-ended data signal DQ IO and idqs is the current drawn by a dual data strobe signal DQS IO during switching. When both the channels are switching simultaneously, the total current required during switching may be expressed as:

$$I_{TOTAL}=2*I_{CHANNEL}=(16*idq)+2*idqs$$

The total necessary on-die capacitance in a dual channel DDR system may be calculated using:

$$C_{DIE}=I_{TOTAL}*(\Delta t/\Delta V)$$

where $\Delta t$ is the switching time of the IO in seconds and $\Delta V$ is the IO supply voltage×(% voltage drop allowed)/100. As shown by the equation above, when the total instantaneous switching current (the current required for switching) is reduced, the on-die capacitance is also reduced.

The disclosed technology includes a method of controlling the instantaneous switching current and reducing the die capacitance requirement by staggering the channels in the dual channel DDR interface so that they do not switch simultaneously. DDR devices use clock signals to clock the address and commands signals into the memory. The memory can use the clock signals to generate a DQ Strobe (DQS) signal during a read through. The DQS signal controls when switching occurs for each channel. Staggering the DQS signal for each channel ensures that the channels do not switch simultaneously.

Specifically, the disclosed controller includes a DDR architecture that includes a dual-channel interface designed to include DQS IO ports configured to generate a first DQS signal that is a distance of substantially 0.125 of the period of a clock signal ($\Delta T$ denoting the 0.125 of the period of the clock signal) ahead of a rising edge of the clock signal and a second DQS signal that is a distance of substantially 0.125 of the period of the clock signal behind the rising edge of a clock signal. If $\Delta T$ is more than a tDQSS then $\Delta T$ is set to tDQSS, where tDQSS is a maximum allowable time between either DQS signal and the rising edge of the clock signal.

FIG. 1A is a functional block diagram of an example data storage device 100 that may be used in the disclosed technology. The example data storage device 100 has a printed circuit board (PCB) 144. A voltage regulator module (VRM) 106, a controller 102, and a memory 104 (e.g., DRAM package) are placed on the PCB 144. The VRM 106 provides the required voltage to the controller 102 and the memory 104 via a power path 108. On-die capacitors (not shown) are placed inside controller die 140, which communicates via a signal path 110 to memory die 142 in the memory 104

The PCB 144 shown in FIG. 1A may be implemented in various storage systems. Data storage devices, such as HDDs or SSDs, often utilize a System on Chip (SoC) integrated circuit that operates as a storage controller. For example, the PCB 144 may be implemented in a hard disk drive (HDD) SoC block, where an HDD controller interacts with memory. In another example, the data storage device 100 may be implemented in a solid-state drive (SSD) system, where a flash controller interacts with the memory (e.g., DRAM) buffer.

Figure 1B:
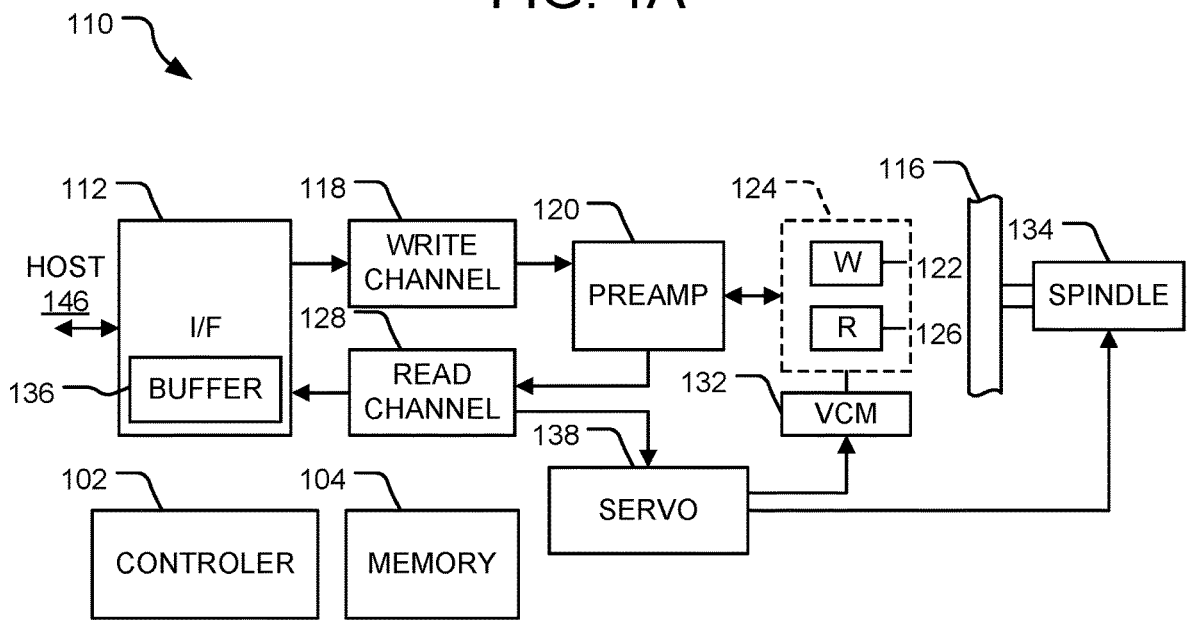
FIG. 1B is a functional block diagram of an example data storage device.

For illustrative purposes, the PCB 144 may be implemented in an example data storage device 110 in FIG. 1B. FIG. 1B provides a simplified functional representation of a data storage device 110 that corresponds to the data storage device 100 of FIG. 1A in some embodiments of the disclosed technology. The data storage device 100 includes the main functional circuits used to control the operation of a controller 102 and a memory 104 (e.g., DRAM, RAM, ROM, etc.).

The controller 102 can take a variety of forms such as a SoC with programmable processing capabilities using firmware stored in a suitable memory location. The memory 104 can take a variety of forms and can be used to store user data from a host device 146. The functionality of the controller 102 and the memory 104 can be incorporated into a single chip, or distributed among different integrated circuit devices and other components (e.g., solid state memory, rotatable memory, etc.).

The data storage device 110 is characterized for purposes of FIG. 1B as a hard disc drive (HDD) that employs magnetic recording to store data to one or more rotatable magnetic recording discs. The device 110 in FIG. 1B includes a top-level controller (e.g., SoC controller) 102. An interface circuit (I/F) 112 communicates with the host device 146 and includes a data buffer 114 to temporarily store data pending transfer between the host device and a rotatable perpendicular data recording medium 116.

A write channel 118 operates to encode input write data from the host to provide a serialized data stream to a preamplifier/driver (preamp) 120. The preamp 120 provides a sequence of write currents to a perpendicular magnetic write element (W) 122 of a data transducer 124 to write data to the medium 116.

During a readback operation, readback signals are transduced by a magneto-resistive (MR) read element (R) 126 of the data transducer 124. The transduced signals are supplied to the preamp 120. The preamp 120 conditions and amplifies the readback signals and provides the same to a read channel 128. The read channel 128 applies signal processing techniques to recover the originally stored data to the buffer 114 pending subsequent transfer to the host.

During both read and write operations, specially configured servo positioning data on the medium 116 are transduced by the read element 126 and, after demodulation by a portion of the read channel 128, are supplied to a servo control circuit 130. The servo control circuit 130 provides positional control signals to a voice coil motor (VCM) 132 coupled to the data transducer 124 to position the respective write and read elements 122, 126 adjacent various data tracks defined on the medium 116.

The servo control circuit 130 further provides control inputs to a spindle motor 134 which rotates the medium 116 during operation. To avoid damage to the device 110, the servo circuit 130 moves the transducer(s) 124 to a safe parking position, such as on a ramp structure or a landing zone, prior to deactivation of the spindle motor 134.

In some implementations, the data storage device 100 may be an SSD that employs non-volatile flash memory to store data from the host device. As with the HDD device 110 of FIG. 1A, a data storage device 100 includes a top level controller (e.g., SoC controller) 141 and an I/F circuit 142 with a data buffer 144, and a read/write/erase (R/W/E) channel (not shown) that provides read, write and erasure capabilities for one or more flash memory arrays.

In the disclosed technology, the controller 102 includes a DDR architecture (described in more detail in FIG. 2) that includes a dual-channel interface designed to include DQ Strobe (DQS) IO ports configured to generate a DQS signal that is substantially 0.125 of a clock signal ($\Delta T$ denoting the 0.125 of the period of the clock signal) away from a rising edge of a clock signal, and another DQS signal that is substantially 0.125 of a clock signal behind the rising edge of a clock signal. If $\Delta T$ is more than a tDQSS then $\Delta T$ is set tDQSS reducing an on-die capacitance requirement for the DDR interface, where tDQSS is a maximum allowable time between either DQS signal and the rising edge of the clock signal.

Figure 2:
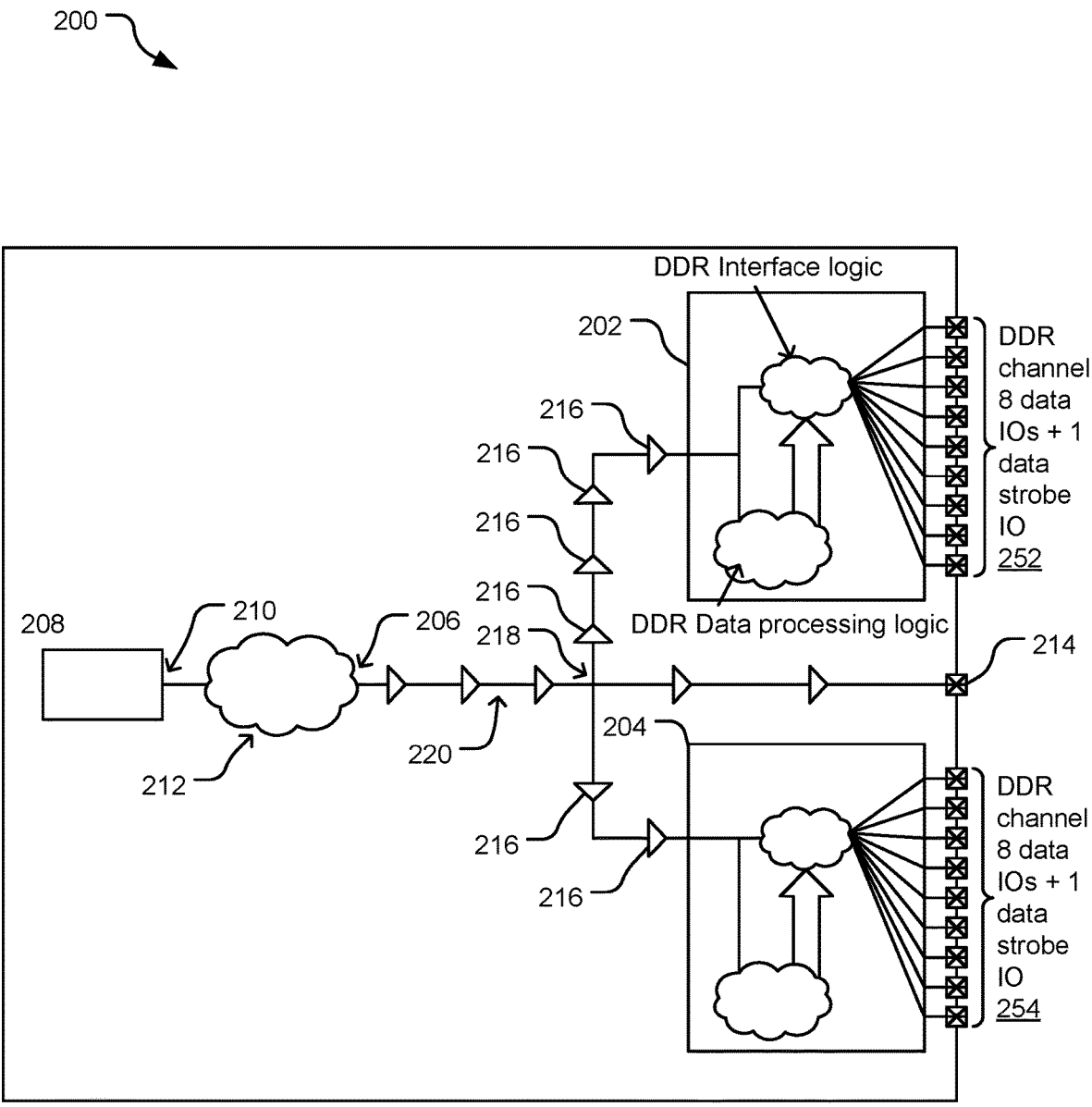
FIG. 2 is a schematic diagram of an example dual channel double data rate in a System-on-Chip controller.

FIG. 2 is a diagram of an example dual channel DDR in an SoC controller 200 with the disclosed technology. In FIG. 2, the SoC controller 200 is an HDD or an SSD controller 200 shown with dual channel DDR (e.g., a DDR Channel 202 and a DDR Channel 204). Dual channel refers to each memory channel accessing two memory modules simultaneously. The DDR Channel 202 and DDR Channel 204 each operate using the same DDR clock signal 206. Each channel has 8 single-ended DQ IO and 1 dual DQS IO operating in a read-write mode.

The SoC controller 200 includes a phase locked loop (PLL) 208 generating a PLL clock output 210. This PLL 208 is an input for a combinational DDR clock generation logic 212 which generates the DDR clock signal 206 which goes to various DDR channels (e.g., the DDR Channel 202 and the DDR Channel 204). The same DDR clock signal is output from a clock IO 214. Each DDR channel also has DDR data processing logic and interface logic. The DDR channel 202 may have 8 data outputs and one data strobe IO UDQS (as illustrated by the data strobe IO 252). The DDR channel 204 may have 8 data outputs and one data strobe IO LDQS (as illustrated by the data strobe IO 254). A clock tree 220 is a combination of buffers and various combinational logic and it defined various paths for clock signal generated by the PLL 208.

The DDR clock signal 206 is staggered so that the DDR Channel 202 and the DDR Channel 204 do not switch simultaneously. To stagger the DDR clock signal 206, buffers 216 are inserted after a divergent point 218. The buffers 216 are inserted so that delay between the DDR Channel 202 and the clock signal 214 is $\Delta T=0.125*T_{CLK}$ on one side and the delay between DDR Channel 204 and the clock signal 214 $\Delta T=0.125*T_{CLK}$ on the other side. One of DDR Channel 202 and DDR Channel 204 precedes the clock signal 214 by $\Delta T$, while the other Channel is preceded by the clock signal 214 by $\Delta T$. The buffers are inserted after actual insertion delay is calculated for each of DDR Channel 202, DDR Channel 204, and the clock IO 214 so that the resultant $\Delta T$ takes into account the insertion delay between the channels, where insertion delay is the amount of time between the clock signal 214 and a respective channel before any buffers are inserted.

To calculate the insertion delay for DDR Channel 202, DDR Channel 204, and the clock IO 214, the actual insertion delay is calculated from the total insertion delay. For purposes of this disclosure, 'T_ch1_id', 'T_ch2_id' and 'T_clk_id' are total insertion delays of the DDR Channel 202, DDR Channel 204, and the clock IO 214, respectively. In some implementations, the total insertion delays are greater than the bit period (T_bit=½*$T_{CLK}$). In cases where the total insertion delay is greater than the bit period, the actual insertion delay is calculated using the amount that the total insertion delay that exceeds the multiple bit periods divided by the single bit period (T-bit) of the clock signal 214. The calculated actual insertion delays are less than the bit period (T-bit).

Figure 3:
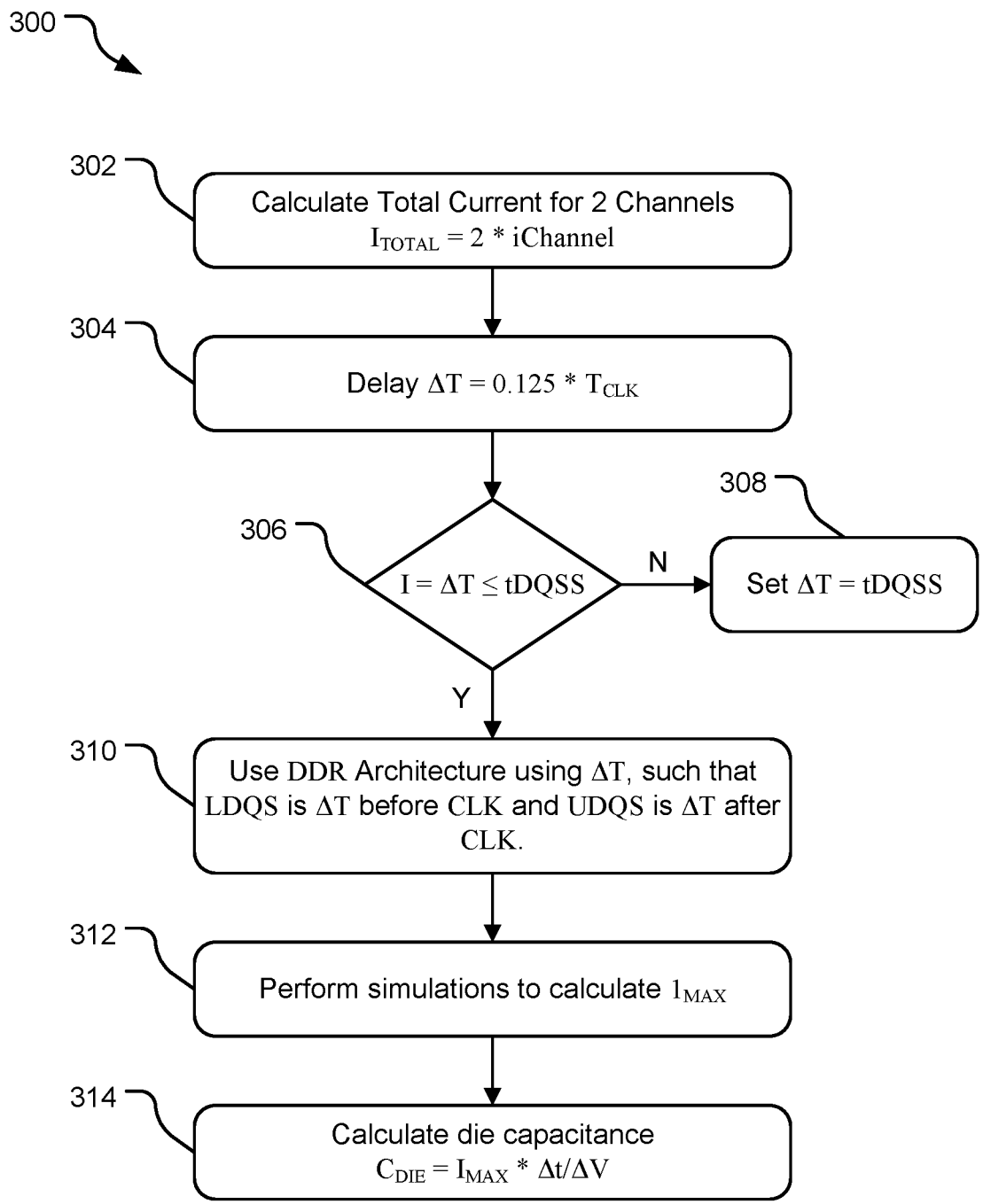
FIG. 3 is a flowchart of example operations in the disclosed technology.

The calculated actual insertion delays are taken into account when inserting the buffers 216. The buffers 216 are inserted after the divergent point 218 so that the effective delay between each channel and the clock signal 214, including the actual insertion delay and delay introduced by the buffers 216 is $\Delta T=0.125*T_{CLK}$. An effective delay between two channels will be $2*\Delta T=2*0.125*T_{CLK}=0.25*T_{CLK}=0.5*T\_bit$ FIG. 3 is a flowchart of example operations 300 of implementing the layout in the disclosed technology. An operation 302 calculates a total current for two channels in a dual-channel DDR interface in a controller per IO at a corner condition, for example, for a condition where both channels are switching simultaneously. In some implementations, calculating a total current for two channels includes calculating a channel current, and calculating a total current for the two channels. In some implementations each channel comprises of 8 single DQ IO and one dual DQS IO where a single DQ IO takes idq current and DQS IO takes idqs current during switching.

A fast part, which may be the fast silicon transistor part of the DDR channel, may be taken at −40 C and high voltage (1.575V) and simulations may be performed to compute an idq and an idqs, where idq is the current drawn by a single-ended data signal DQ IO and idqs is the current drawn by a dual data strobe signal DQS IO during switching. The current a single channel uses during switching may be modeled as:

$$I_{CHANNEL}=(8*idq)+idqs$$

A corner condition current ($I_{TOTAL}$) is computed, with both channels switching simultaneously. When both the channels are switching simultaneously, the total current required during switching may be expressed as:

$$I_{TOTAL}=2*I_{CHANNEL}=(16*idq)+2*idqs$$

An operation 304 takes a delay $\Delta T=0.125*T_{CLK}$, where $T_{CLK}$ is time period of the clock signal. Taking a delay may include inserting buffers after a divergent point in the controller such that a delay between the two channels and a clock becomes 0.125 times a period of a clock signal on either side of the clock to create a modified dual-channel DDR interface.

An operation 306 then determines whether the delay $\Delta T$ is less than or equal to a predetermined tDQSS value. The tDQSS parameter is the maximum time delay between a DQS signal and the rising edge of the clock signal. If operation 306 determines the delay $\Delta T$ is more than tDQSS, then an operation 308 sets delay $\Delta T$ to the predetermined tDQSS value, to comport with the tDQSS parameter.

If operation 306 determines the delay $\Delta T$ is less than or equal to the predetermined tDQSS value, then an operation 310 performs operations and uses a DDR architecture using delay $\Delta T$, such that LDQS is $\Delta T$ before CLK and UDQS is $\Delta T$ after CLK. The data lane should align accordingly. In an alternative implementation, LDQS is $\Delta T$ after CLK and UDQS is $\Delta T$ before CLK.

In some implementations, one-eighth (0.125) of a period of a clock signal ($\Delta T$) may be compared with a maximum allowable time between either DQS signal and the rising edge of the clock signal (tDQSS), and setting $\Delta T$ to tDQSS in response to determining that $\Delta T$ is greater than tDQSS.

In some implementations, DDR may be used such that a data strobe IO of one channel is $\Delta T$ before the clock signal and a data strobe IO of another channel is $\Delta T$ after the clock signal.

One channel DQS, say LDQS is implemented such that LDQS proceeds CLK by $\Delta T$ while other channel UDQS is implemented such that CLK proceeds UDQS by $\Delta T$. Data DQ[0-7] is half bit ($T_{CLK}$) away from LDQS and DQ[8-15] is half bit ($T_{CLK}$) away from UDQS. An operation 312 calculates a final maximum current ($I_{MAX}$) using simulation software. The simulation software performs signal integrity and power integrity simulations.

An operation 314 calculates a final value of on-die capacitance using the equation:

$$C_{DIE}=I_{MAX}*(\Delta t/\Delta V)$$

where $\Delta t$ is the switching time of the IO in seconds and $\Delta V$ is the IO supply voltage×(% voltage drop allowed)/100.

Figure 4:
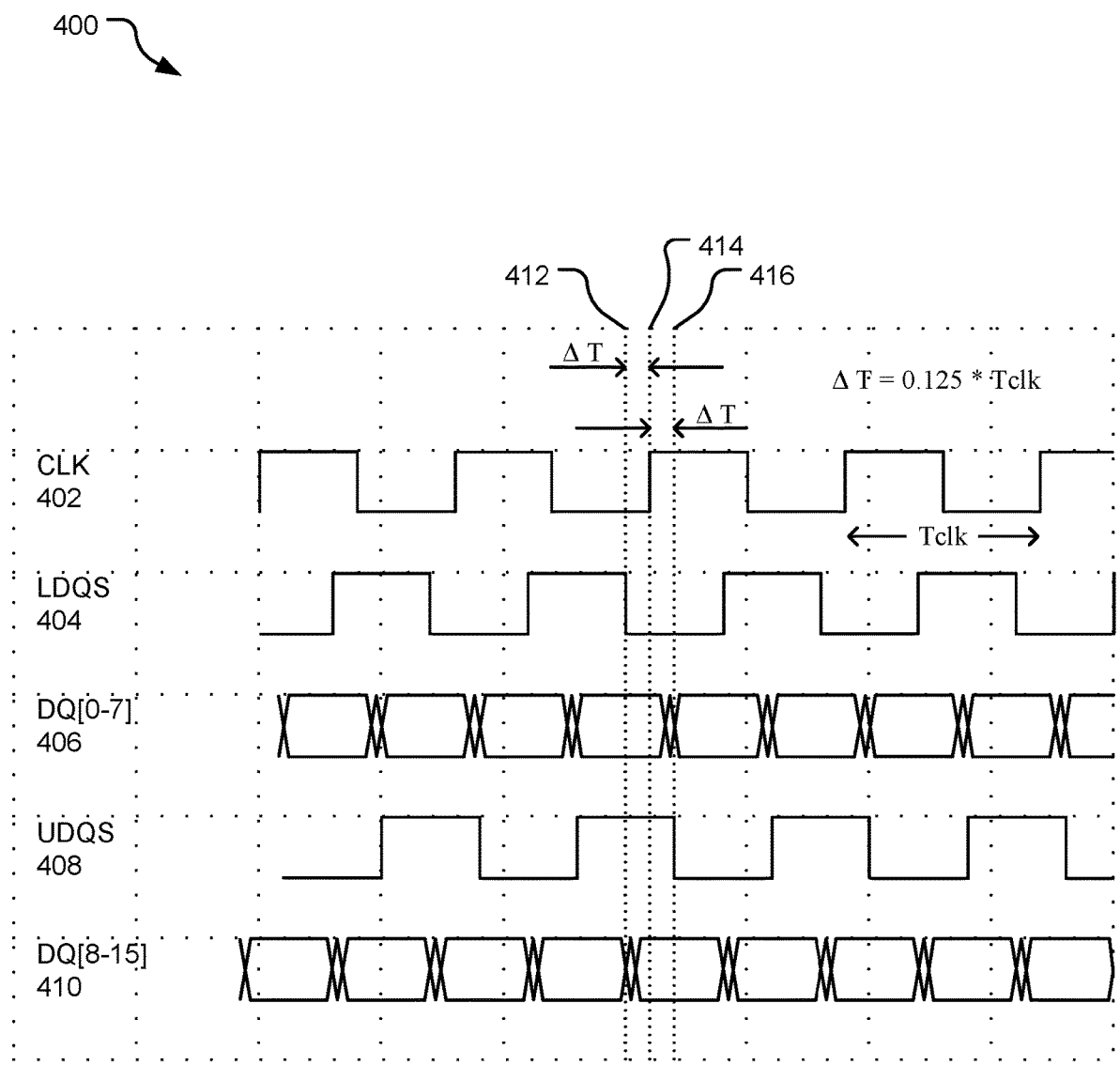
FIG. 4 is a timing chart of an example architecture in the disclosed technology.

FIG. 4 is a timing chart 400 of an example layout in the disclosed technology. One DQS channel, shown in FIG. 4 as LDQS 404, is implemented such that LDQS 404 proceeds CLK 402 by $\Delta T$ (shown by the difference between rising edge 414 and LDQS 412) while other channel UDQS 408 is implemented such that CLK 402 proceeds UDQS 408 by $\Delta T$ (shown by the difference between rising edge 414 and UDQS 416). Data DQ[0-7] 406 is half bit ($T_{CLK}$) away from LDQS 404 and DQ[8-15] 410 is half bit ($T_{CLK}$) away from UDQS 408. The staggering shown by the timing chart 400 ensures that the two DQS channels are not switching simultaneously, so that less current is drawn at any given time during operation, requiring fewer on die capacitors from which to draw the current. Further, by staggering the channels as shown in FIG. 4, the capacitance can be accurately calculated earlier in the design cycle, allowing for a more efficient design.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A dual-channel DDR interface, comprising:
   a lower DQ Strobe (LDQS) IO port configured to generate a LDQS signal that is substantially 0.125 of a period of a clock signal ahead of a rising edge of the clock signal;
   an upper DQS (UDQS) IO port configured to generate an UDQS signal that is substantially 0.125 of the period of the clock signal behind the rising edge of the clock signal;
   a first plurality of data ports, wherein each of the first plurality of data ports is configured to generate a data signal that is substantially 0.25 of the period of the clock signal away from the LDQS signal; and
   a second plurality of data ports, wherein each of the second plurality of data ports is configured to generate a data signal that is substantially 0.25 of the period of the clock signal away from the UDQS signal.

2. The dual-channel DDR interface of claim 1, further comprising:
   a module to compare 0.125 of the period of the clock signal ($\Delta T$) with a maximum allowable time between the LDQS signal and the rising edge of the clock signal (tDQSS) and in response to determining that $\Delta T$ is greater than tDQSS, setting $\Delta T$ to tDQSS.

3. The dual-channel DDR interface of claim 1, further comprising:
   a module to compare 0.125 of the period of the clock signal ($\Delta T$) with a maximum allowable time between the UDQS signal and the rising edge of the clock signal (tDQSS) and in response to determining that $\Delta T$ is greater than tDQSS, setting $\Delta T$ to tDQSS.

4. A system comprising:
   a dual-channel DDR interface, including:
      a plurality of DQ Strobe (DQS) IO ports including a lower DQS IO port and an upper DQS IO port, the lower DQS IO port configured to generate a LDQS signal that is substantially 0.125 of the period of the clock signal ahead of the rising edge of the clock signal and the upper DQS IO port configured to generate an UDQS signal that is substantially 0.125 of the period of the clock signal behind the rising edge of the clock signal;
      a first plurality of data ports, wherein each of the first plurality of data ports is configured to generate a data signal that is substantially 0.125 of the period of the clock signal away from the LDQS signal; and
      a second plurality of data ports, wherein each of the second plurality of data ports is configured to generate a data signal that is substantially 0.125 of the clock signal away from the UDQS signal.

5. The system of claim 4, the dual-channel DDR interface further including:
   a module to compare 0.125 of the period of the clock signal ($\Delta T$) with a maximum allowable time between the LDQS signal and the rising edge of the clock signal (tDQSS) and in response to determining that $\Delta T$ is greater than tDQSS, setting $\Delta T$ to tDQSS.

6. The system of claim 4, the dual-channel DDR interface further including:
   a module to compare 0.125 of the period of the clock signal ($\Delta T$) with a maximum allowable time between the UDQS signal and the rising edge of the clock signal (tDQSS) and in response to determining that $\Delta T$ is greater than tDQSS, setting $\Delta T$ to tDQSS.

7. A method of operating a dual channel DDR interface comprising:
   generating a LDQS signal that is substantially 0.125 of a period of a clock signal ahead of a rising edge of the clock signal;
   generating a UDQS signal that is substantially 0.125 of the period of the clock signal behind the rising edge of the clock signal;
   generating a first data signal that is substantially 0.25 of the period of the clock signal away from the LDQS signal; and
   generating a second data signal that is substantially 0.25 of the period of the clock signal away from the UDQS signal.

8. The method of claim 7, further comprising:
   comparing 0.125 of the period of the clock signal ($\Delta T$) with a maximum allowable time between the LDQS signal and the rising edge of the clock signal.

9. The method of claim 8, further comprising:
   setting $\Delta T$ to the rising edge of the clock signal in response to a determination that $\Delta T$ is greater than the rising edge of the clock signal.

10. The method of claim 7, further comprising:
    comparing 0.125 of the period of the clock signal ($\Delta T$) with a maximum allowable time between the UDQS signal and the rising edge of the clock signal.

11. The method of claim 10, further comprising:
    setting $\Delta T$ to the rising edge of the clock signal in response to a determination that $\Delta T$ is greater than the rising edge of the clock signal.

12. The method of claim 7, wherein the LDQS signal is generated by a lower DQ Strobe (LDQS) TO port and the UDQS signal is generated by an upper DQS (UDQS) TO port.

* * * * *